US008109777B2

(12) United States Patent  
Zhu

(10) Patent No.: US 8,109,777 B2
(45) Date of Patent: Feb. 7, 2012

(54) EDGE CONNECTOR FOR REVERSE INSERTION OF DAUGHTER BOARD

(75) Inventor: Jian-Kuang Zhu, Kunshan (CN)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 0 days.

(21) Appl. No.: 12/941,094

(22) Filed: Nov. 8, 2010

(65) Prior Publication Data

US 2011/0053388 A1 Mar. 3, 2011

Related U.S. Application Data

(63) Continuation of application No. 12/315,392, filed on Dec. 3, 2008, now Pat. No. 7,828,574.

(30) Foreign Application Priority Data

Dec. 3, 2007 (CN) .......................... 2007 1 0190571

(51) Int. Cl.
*H01R 13/62* (2006.01)
(52) U.S. Cl. ....................................................... 439/326
(58) Field of Classification Search .................. 439/326, 439/630, 260
See application file for complete search history.

(56) References Cited

U.S. PATENT DOCUMENTS

| 4,678,252 | A | * | 7/1987 | Moore | 439/62 |
| 5,836,780 | A | * | 11/1998 | Mizumura et al. | 439/326 |
| 5,944,536 | A | * | 8/1999 | Seong et al. | 439/79 |
| 6,850,409 | B1 | * | 2/2005 | Triebes et al. | 361/679.32 |
| 6,955,554 | B2 | * | 10/2005 | Korsunsky et al. | 439/328 |
| 7,114,974 | B2 | * | 10/2006 | Korsunsky et al. | 439/325 |
| 7,134,895 | B1 | * | 11/2006 | Choy et al. | 439/326 |
| 7,134,896 | B1 | * | 11/2006 | Chen | 439/326 |
| 7,182,618 | B1 | * | 2/2007 | Choy et al. | 439/328 |
| 7,300,299 | B2 | * | 11/2007 | Wang | 439/326 |
| 7,534,146 | B2 | * | 5/2009 | Chien et al. | 439/668 |
| 7,628,655 | B1 | * | 12/2009 | Chen | 439/660 |
| 2003/0171014 | A1 | * | 9/2003 | Lin | 439/79 |
| 2003/0207600 | A1 | * | 11/2003 | Ho | 439/79 |
| 2005/0048828 | A1 | * | 3/2005 | Ho et al. | 439/326 |
| 2005/0130506 | A1 | * | 6/2005 | Kato et al. | 439/686 |
| 2006/0230659 | A1 | * | 10/2006 | Hu | 40/544 |
| 2007/0032116 | A1 | * | 2/2007 | Liang | 439/326 |
| 2007/0059964 | A1 | * | 3/2007 | Choy et al. | 439/328 |

FOREIGN PATENT DOCUMENTS

| TW | M289534 | 4/2006 |
| TW | I281373 | 11/2006 |

* cited by examiner

*Primary Examiner* — Tulsidas C Patel
*Assistant Examiner* — Harshad Patel
(74) *Attorney, Agent, or Firm* — Wei Te Chung; Andrew C. Cheng; Ming Chieh Chang

(57) ABSTRACT

A compact electrical connector assembly comprises a printed circuit board having a predetermined thickness and defining a first face and a second face opposite to the first face. A low profile electrical connector sits on the first face of the printed circuit board and comprises an insulating housing defining a longitudinal central slot opened forwardly with first contacts and second contacts respectively retained at opposite sides of the central slot. A card is inserted into the central slot at an angle with regard to the printed circuit board, and then rotated from the second face to the first face of the printed circuit board until reaching to a secured position which is substantially overlapped with the printed circuit board.

20 Claims, 8 Drawing Sheets

EDGE CONNECTOR FOR REVERSE INSERTION OF DAUGHTER BOARD

This application is a continuation application of U.S. patent application Ser. No. 12/315,392 filed on Dec. 3, 2008, now U.S. Pat. No. 7,828,574 issued on Nov. 9, 2010.

BACKGROUND OF THE INVENTION

1. Field of the Invention

The present invention relates to an electrical connector, and more particularly to an edge connector with daughter boards such as memory card or the like rotatably inserted thereinto and locked therein in a parallel position.

2. Description of the Related Art

A conventional card edge connector, which includes a longitudinal card-inserting slot and two rows of contacts arranged on two opposite sides of the slot. The connector is assembled on a mother board or a PCB and a memory card is downwards inserted into the card-inserting slot in a slantwise direction relative to the PCB and then downwards rotates until parallel to the PCB and locked by a latching device, wherein resilient contacting portions of the contacts touch corresponding electrical pads of the card to complete a connection between the card and the PCB. To meet different usage circumstance, varies edge connectors are required and developed.

SUMMARY OF THE INVENTION

Accordingly, an object of the present invention is to provide an edge connector with reverse insertion of a daughter board.

In order to achieve the object set forth, an electrical connector adapted for receiving a memory module therein, comprises an insulating housing defining a central slot extending along a longitudinal direction with a forward opening thereof, and the slot being surrounded by a first wall and a second wall opposite to the first wall. A plurality of first contacts are located in the first wall, each having a first contacting portion projecting into the slot and a first solder portion extending outwardly. A plurality of second contacts are located in the second wall, each having a second contacting portion projecting into the slot and a second solder portion extending outwardly. The first and second solder portions commonly define a mounting face on which the electrical connector is mounted. The first contacting portions are located in front of the second contacting portions in a front-to-rear direction perpendicular to the longitudinal direction so as to allow one end of the memory module slantwise inserted into the central slot initially under condition that the other end of the memory module is overlapped with the mounting face, and then rotated the memory module toward the first wall until reaching to a horizontal level.

Other objects, advantages and novel features of the invention will become more apparent from the following detailed description of the present embodiment when taken in conjunction with the accompanying drawings.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

Figure 1:
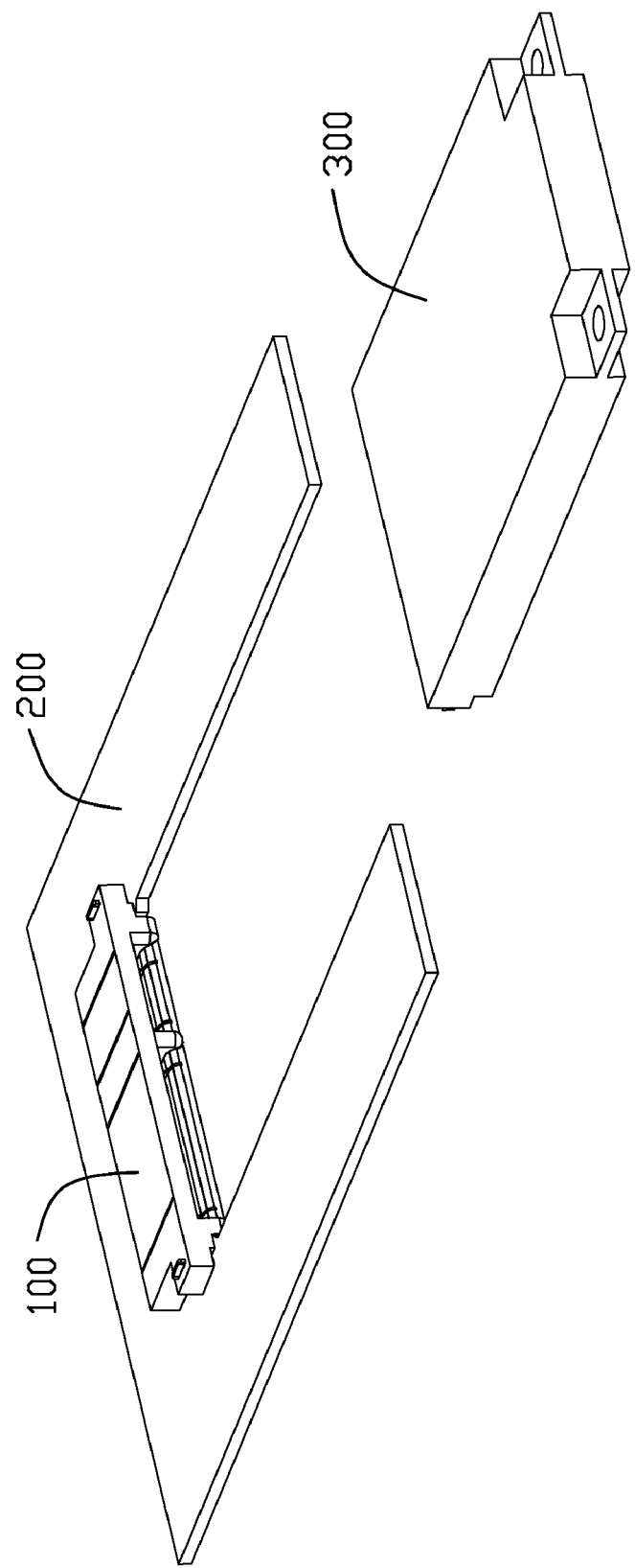
FIG. 1 is a perspective view of an edge connector assembled in a PCB and a card which is adapted for being inserted into the edge connector in accordance with the present invention.

Reference will be made to the drawing figures to describe the present invention in detail, wherein depicted elements are not necessarily shown to scale and wherein like or similar elements are designated by same or similar reference numeral through the eight views and same or similar terminology.

Figure 2:
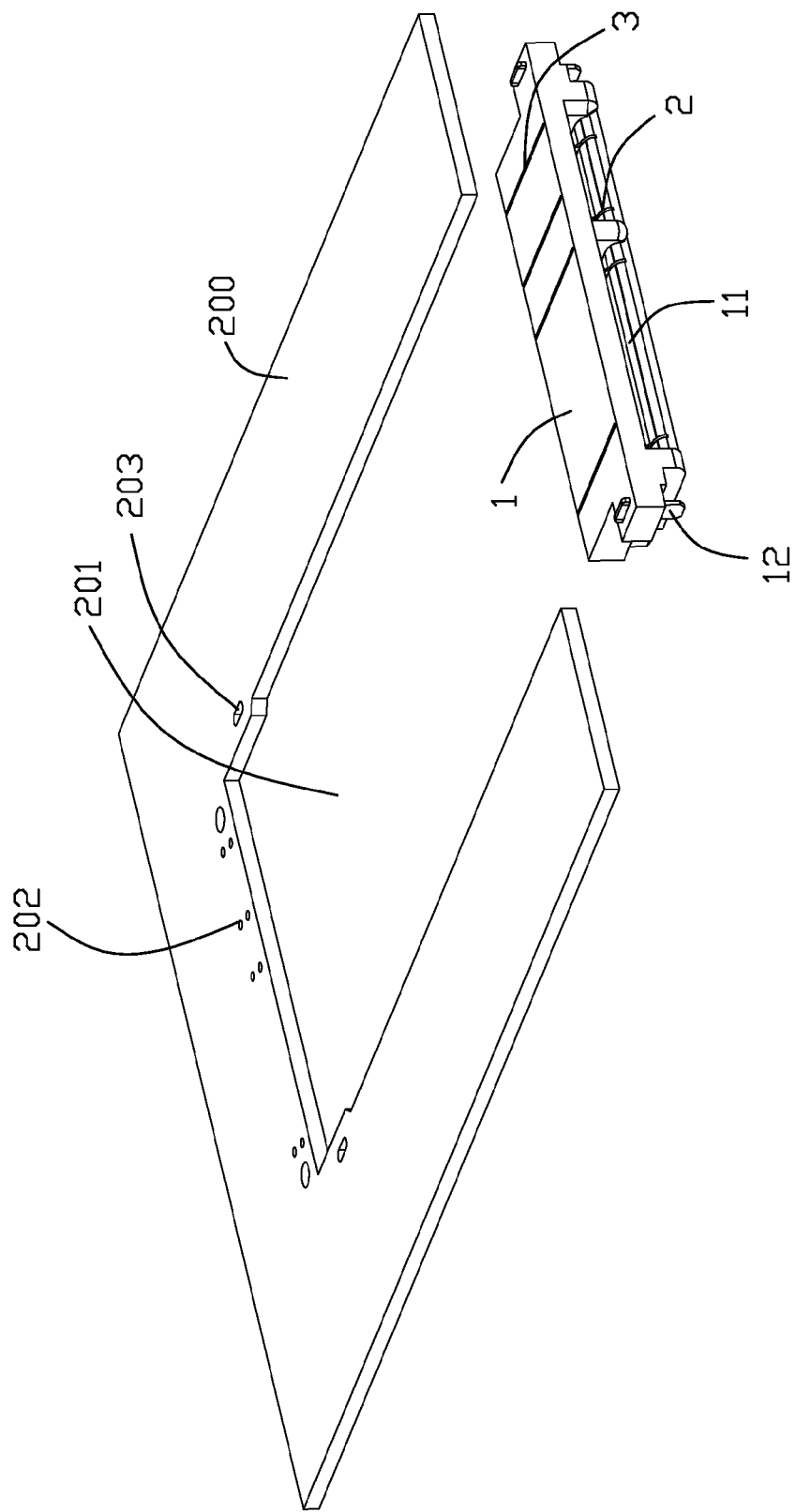
FIG. 2 is a perspective view of edge connector and the PCB of FIG. 1.

Referring to FIG. 1, a sunk type card edge connector 100 is adapted for being assembled in a large notch defined on a PCB 200 and being inserted by a daughter board such as memory card 300 or the like, so as to complete electrical connection between the PCB and the card. As shown in FIG. 2, the connector includes an insulating housing 1 with a forward-opened card-receiving slot 11 along a longitudinal direction and a plurality of conductive terminals 2, 3 (only some are shown in FIG. 2 for simplification) located in opposite inside walls of the slot 11. The plurality of terminals are arranged offsetting along the longitudinal direction. The PCB 200 has corresponding terminal holes 202 at an inner edge thereof, opposite to a front opening of the notch 201 of the PCB, to be inserted and soldered by soldering legs of the terminals. The PCB has two holes 203 at side edges adjacent to the inner edge thereof to be inserted and retained by a pair of metallic board locks 12 which are retained in opposite end flanges of the housing so as to retain the housing in the notch 201.

Figure 3:
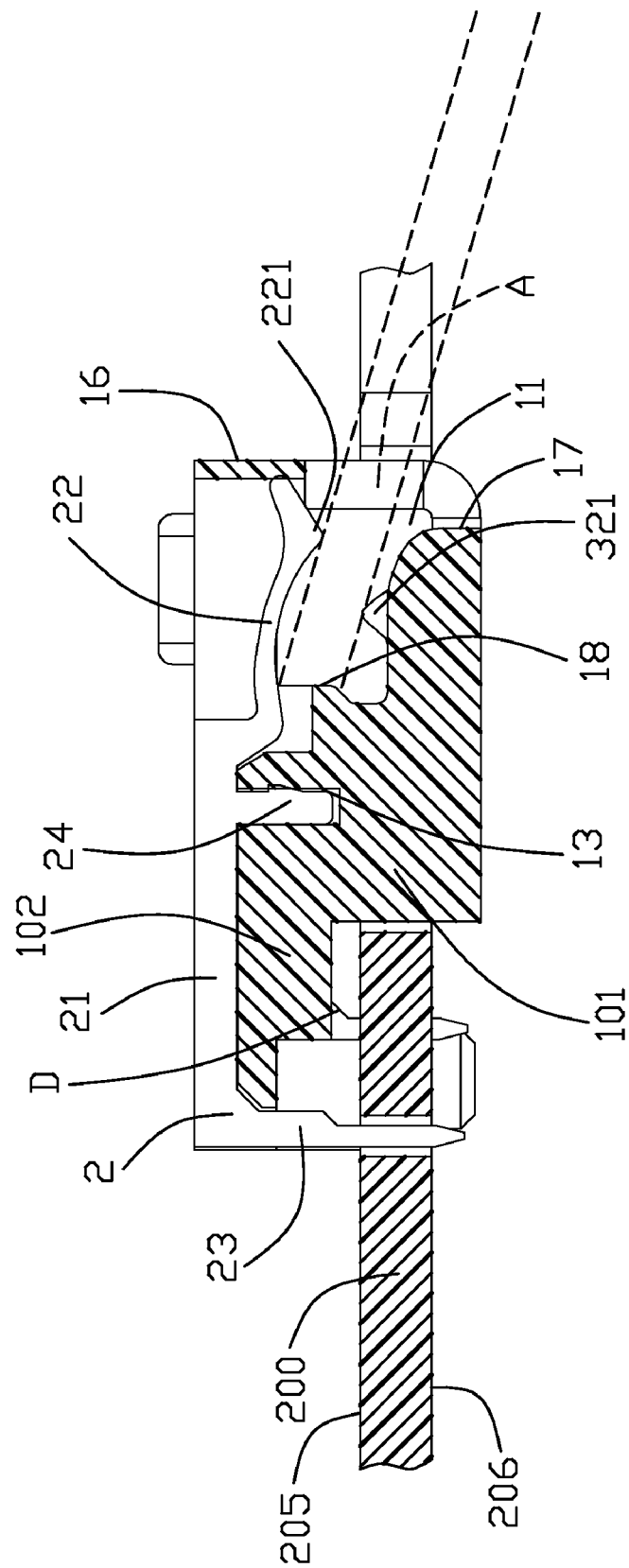
FIG. 3 is a schematic cross-sectional view of the connector in FIG. 1 to show the configuration of a terminal of an upper row.

Referring to FIG. 3, the first terminals 2 of one upper row are arranged above the slot. Each first terminal 2 includes a longitudinal base portion 21, a resilient contacting portion 22 extending forward and downwards into the slot 11 from a front end of the base portion and a soldering leg 23 perpendicular bending downward from a back end of the base portion 21. A retaining portion 24 with tabs at sides thereof, perpendicularly extends from the base portion near to the front end of the base portion and is retained in the slit 13 opened upward so that the first terminals of the upper row are inserted into corresponding passageways which are arranged on the housing and running through the top face of the housing along an up-to-down direction. The soldering legs 23 are supported by the back of the housing.

Figure 4:
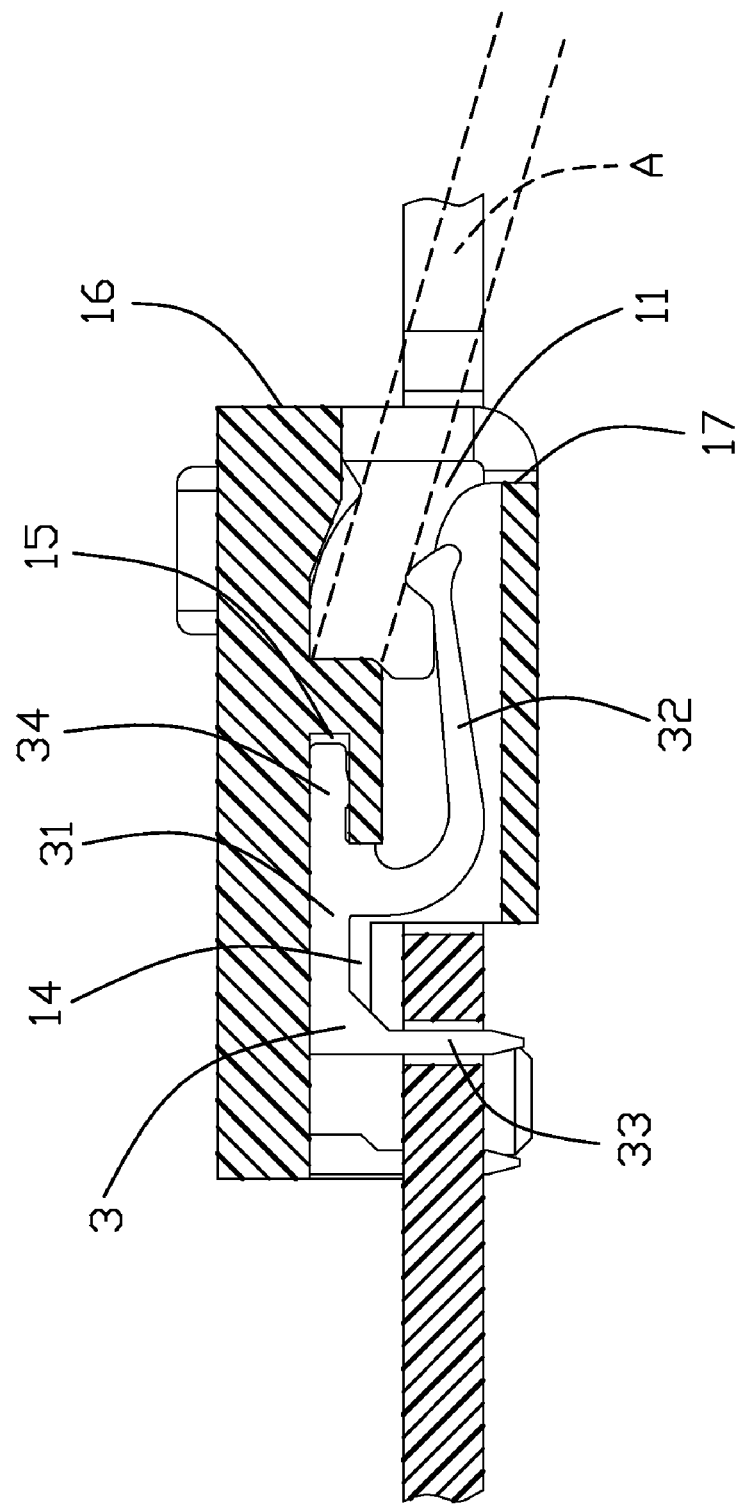
FIG. 4 is a schematic cross-sectional view of the connector in FIG. 1 to show the configuration of a terminal of a lower row.

Referring to FIG. 4, the second terminals 3 of one lower row are arranged on the lower wall and below the slot 11. Each second terminal 3 includes a base portion 31, a resilient contacting portion 32 extending downwards firstly and then bending forwardly to be inserted into the slot 11 from a front end of the base portion 31 and a soldering leg 33 perpendicularly extending downward from a back end of the base portion 31. A retaining portion 34 with tabs at sides thereof, forward projects from the front end of the base portion 31 and is inserted into a slit 15 opened rearwards in a rear-to-front direction. The soldering legs 33 of the second terminals 3 are located in front of the soldering legs 23 of the first terminals 2.

Referring to FIGS. 3 and 4, the housing 1 has a front portion 101 and a rear portion 102 smaller than the front portion 101 (with respect to a top face 205 of the PCB in a normal state). The rear portion 102 extends downward horizontally from the front portion 101 and defines a recess thereunder. The front portion 101 is embedded in the notch 201 of the PCB and the rear portion 102 defines a mounting face D confronting to the top face of the PCB. The contacting points 221, 321 at free ends of the contacting portions 22, 32 are exposing in the slot 11, wherein the contacting points 221 of the first terminals 2 are nearer to a front opening of the slot 11 than that of the second terminals 3, i.e. far away from an inner face 18 of the slot 11 so as to form a downward slant inserted space A as shown in FIG. 3. The inserted space A slants downwards to the PCB from an upper lever thereof. A front face 16 of an upper wall is in front of a front face 17 of the lower wall.

Figure 5:
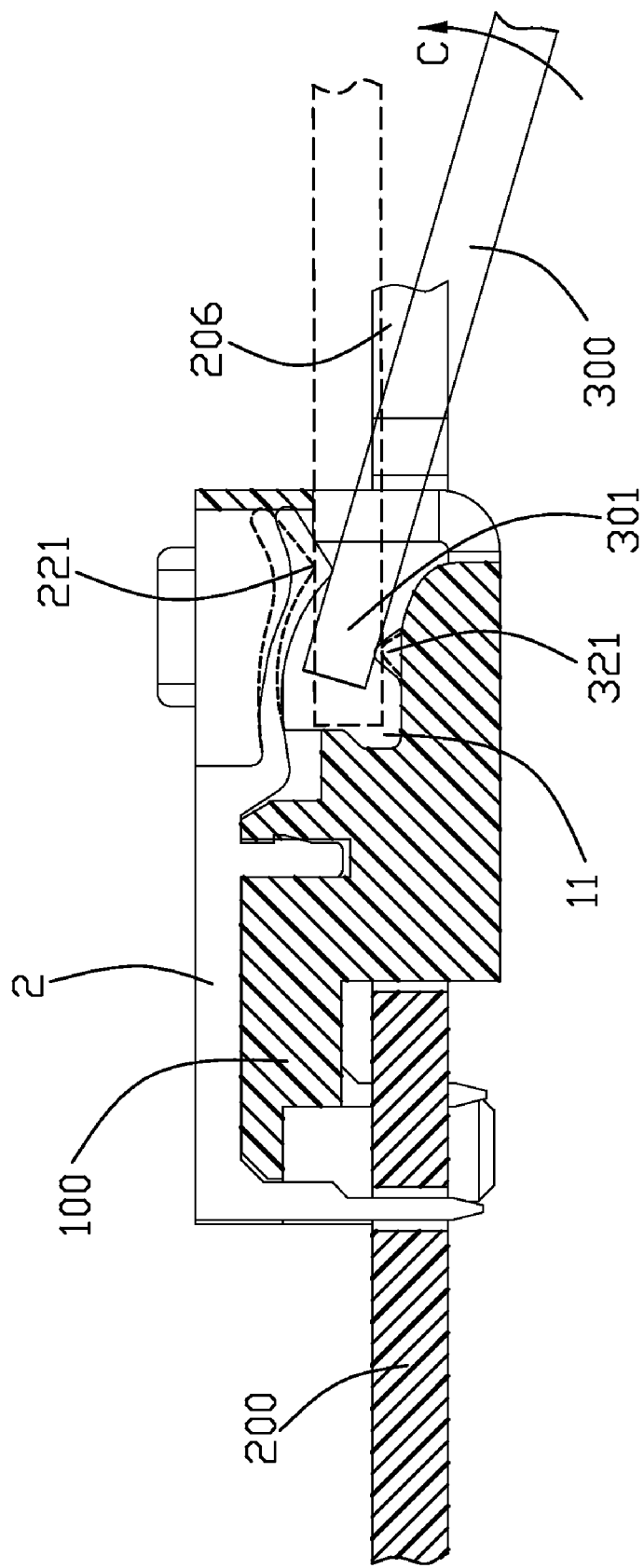
FIG. 5 is similar view of FIG. 3 wherein the card is inserted into the connector.

Referring to FIG. 5, the card 300 is inserted into the slot 11 along the inserted space A and rotated about a front mating edge portion 301 along a direction C until the card is parallel to the PCB 200 and locked by the latching device 6 which will be described hereinafter. The connector 100 is assembled in the notch 201 in a normal direction, i.e., from the top face 205 of the PCB 200 to a lower face of 206 the PCB 200, therefore the card 300 is inserted into the slot 11 from the lower face 206 of the PCB along a reverse direction, which is substantially a downside-up direction. In application, the connector 100 is located in an electronic apparatus such as a notebook or the like. When the connector 100 is located on the PCB with the slot 11 facing downwards, the users can insert the card from the bottom of the notebook, which will facility the replacement of an iffy card in the notebook through a large opening in the bottom of the notebook without taking apart the notebook.

Figure 6:
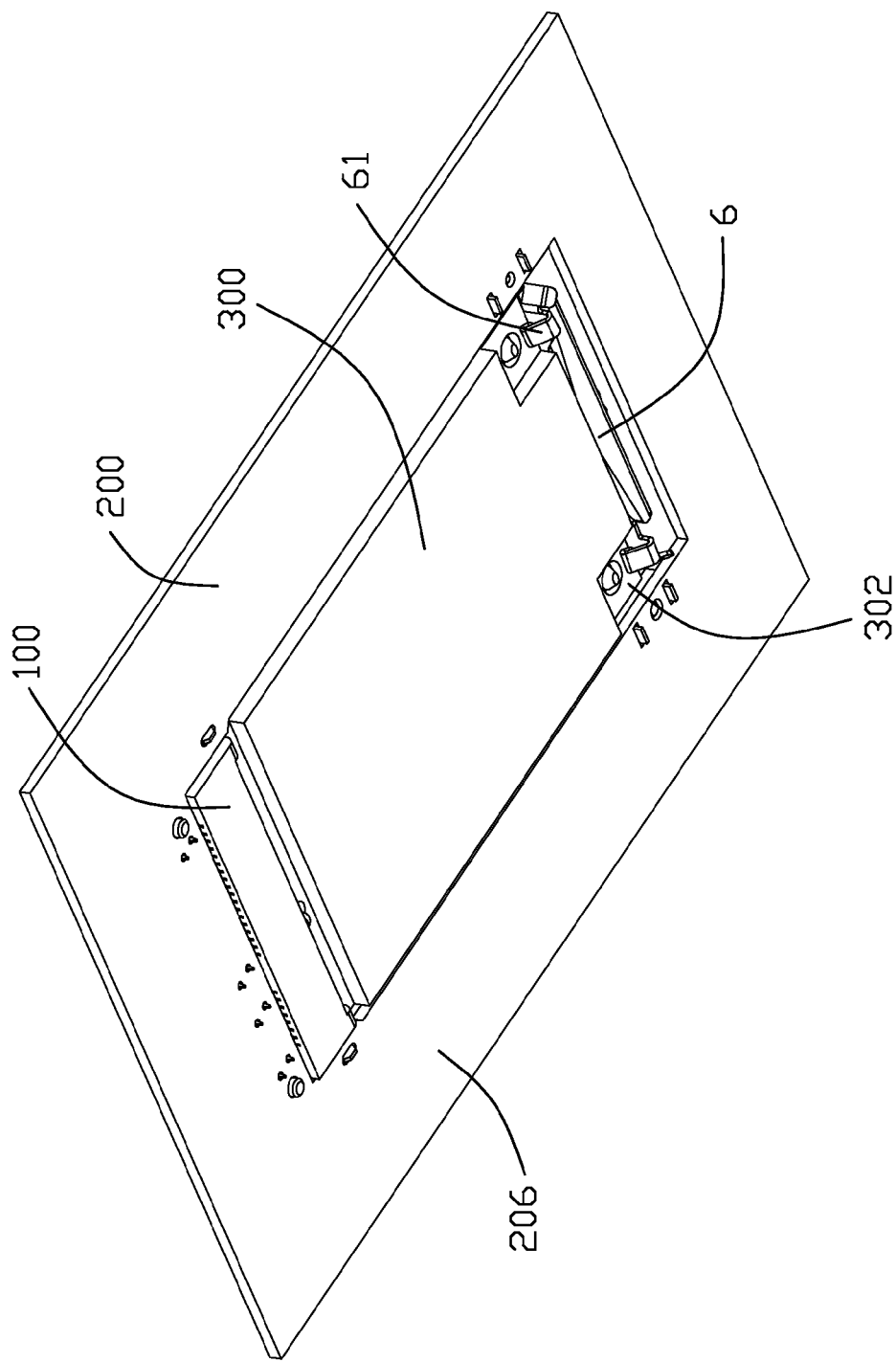
FIG. 6 is a perspective view of a connector assembly wherein the connector is mounted in the PCB and the card is retained in the connector by a latching device.
Figure 7:
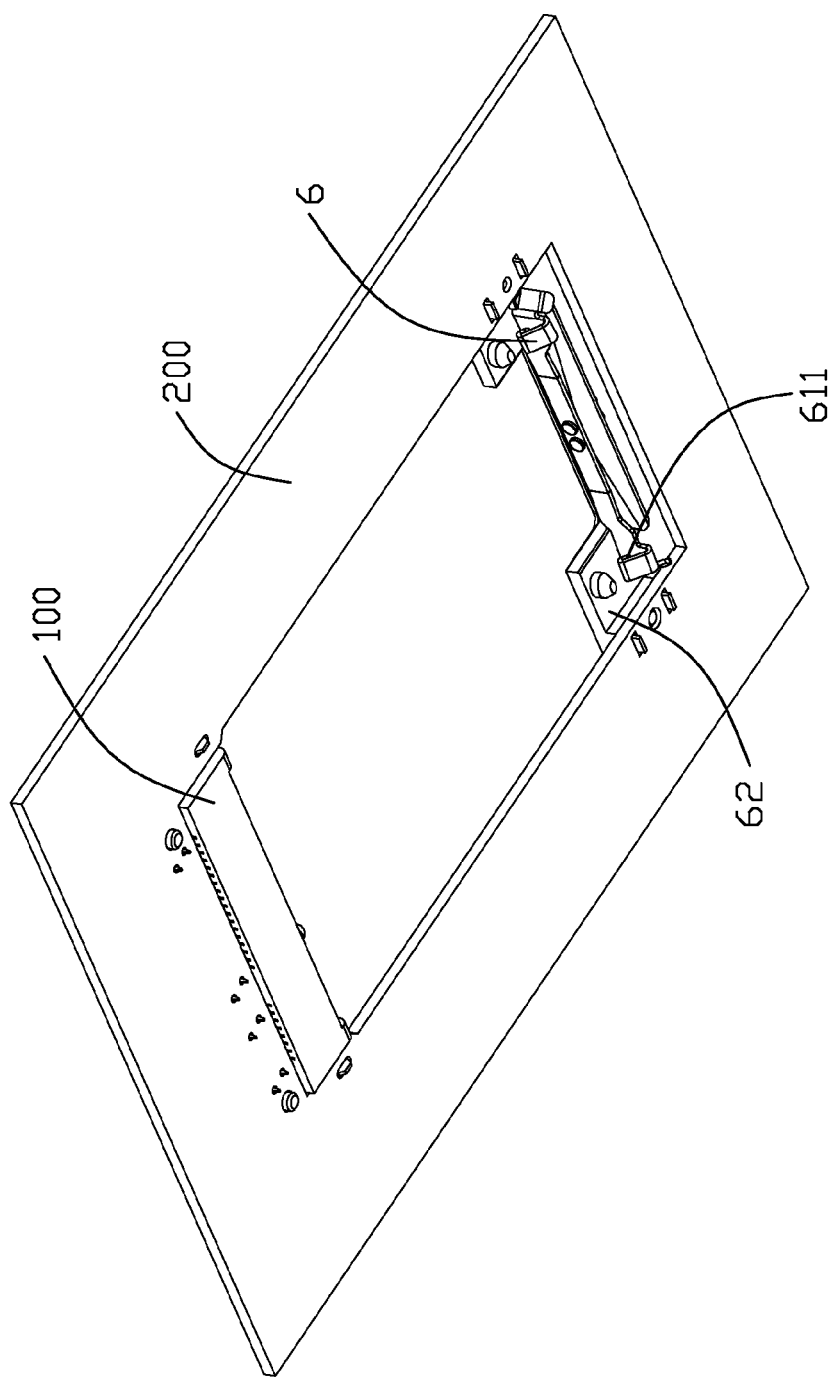
FIG. 7 is a perspective view of the connector assembly shown in FIG. 6 without the card.
Figure 8:
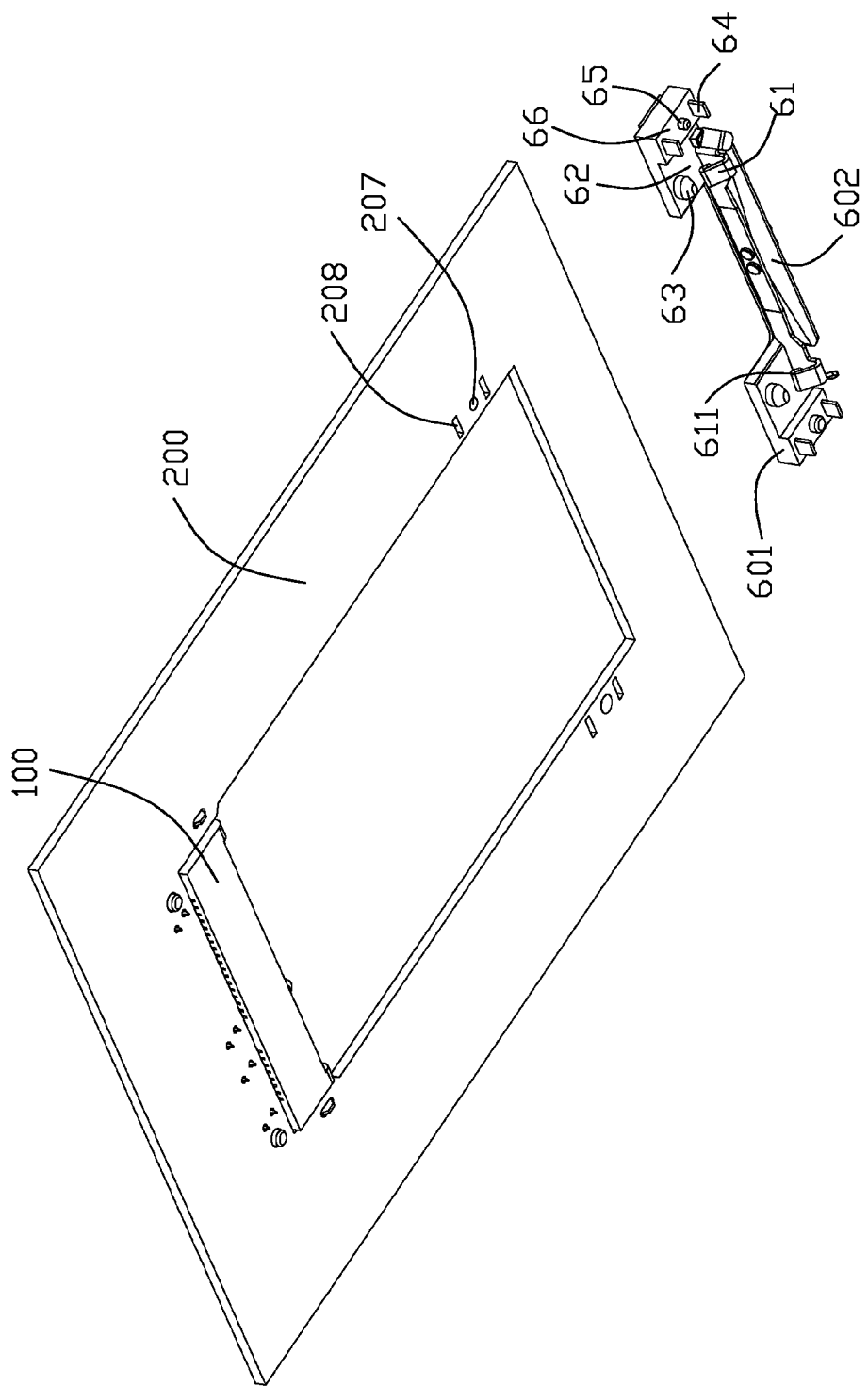
FIG. 8 is an exploded perspective view of the connector assembly shown in FIG. 7.

FIGS. 6, 7 and 8 show the usage of the latching device 6, the latching device includes supporting faces 62 facing downward, mounting faces 66 confronting to the PCB and latching portions 61. The latching device is retained in the notch 201 by the mounting faces 66 abutting against the top face 205 of the PCB and a rear retaining portion 302 of the card 300 which is opposite to the front mating edge portion 301 is sandwiched between the supporting faces 62 and the latching portions 61. The latch device 6 is substantially a C-shaped configuration with two base portions 601 at opposite ends connected by a bridge portion 602. A supporting face 62 and a mounting face 66 are defined on a bottom face of the base portion 601, wherein the mounting face 66 is lower than the supporting portion 62 with relative to the top face 205 of the PCB. A card-positioning post 63 unitarily extends downward from the supporting face 62. A PCB-positioning post 65 extends downwards from the mounting face 66 to be inserted into a hole 207 defined in the PCB. A pair of PCB-retaining board locks 64 at sides of the PCB-positioning post 65 project downward from the mounting face 66 to be inserted into holes 208 defined in the PCB. A long metal plate is attached to the bridge portion 602 with a bending portion upwards bending toward the supporting face 62 with a distance equal to the height of the card 300. The bending portion functions as the locking portion 61 with a pressing portion 611 at a front end thereof, confronting to the supporting face 62. Alternatively, the pressing portion 611 is configured as point contact or line contact.

Referring to FIGS. 6 and 7, the supporting faces 62 and the mounting faces 66 are in a same side of the base portion 602 of the latching device 6. In the preferred embodiment, the pressing portion 611 is located in the notch and the supporting faces 62 is higher than the top face of the PCB 200 to allow the card 300 to be received within the notch 201 for decrease the whole high of the connector and the card. By nature, the height of the supporting faces 62 is designed by the sink-dimension of the card in the notch. The corresponding retaining portion 302 sandwiched between the supporting faces 62 and the mounting faces 66 is thinner than the PCB, that causing one of the pressing portion 611 and the supporting portion 62 is in the notch 201 and the other of the pressing portion 611 and the supporting portion 622 is over or below the notch 201, i.e. over the top face 205 of the PCB or below the lower face 206 of the PCB.

However, the disclosure is illustrative only, changes may be made in detail, especially in matter of shape, size, and arrangement of parts within the principles of the invention.

What is claimed is:

1. An electrical connector adapted for receiving a memory module therein, comprising:
    an insulating housing defining a central slot extending along a longitudinal direction with a forward opening thereof, the slot being confined by a first wall and a second wall opposite to the first wall;
    a plurality of first contacts located in the first wall, each having a first contacting portion projecting into the slot and a first solder portion extending outwardly;
    a plurality of second contacts located in the second wall, each having a second contacting portion projecting into the slot and a second solder portion extending outwardly;
    said electrical connector defining a mounting face via which the electrical connector is allowed to be mounted to a printed circuit board in a mounting direction which is perpendicular to said printed circuit board and is essentially defined from the first wall to the second wall; wherein
    the first contacting portions are located in front of the second contacting portions in a front-to-rear direction perpendicular to the longitudinal direction for allowing the memory module to be slantwise inserted into the central slot initially under condition of being roughly closer to the second wall and away from the first wall, and then rotated toward the first wall in a direction essentially opposite to said mounting direction until reaching to a horizontal level.

2. The electrical connector as described in claim 1, wherein the first wall defines a front face which is adjacent to the opening and locates in front of that of the second wall in said front-to-rear direction.

3. The electrical connector as described in claim 2, wherein each second contact has a smaller dimension than that of the first contact.

4. The electrical connector as described in claim 2, wherein the first wall is farther to the mounting face than the second wall in a vertical direction perpendicular to the front-to-rear direction and the longitudinal direction.

5. An electrical connector assembly adapted for connecting a memory module to a printed circuit board, comprising:
    a printed circuit board, having a predetermined thickness and defining a first face and a second face opposite to the first face;

an electrical connector, mounted onto the first face of the printed circuit board along a first direction defined from the first face of the printed circuit board to the second face of the printed circuit board, comprising an insulating housing defining a central slot extending along a longitudinal direction, a first wall and a second wall located at opposite sides of the central slot and offset with each other at a front end thereof in a front-to-rear direction perpendicular to said longitudinal direction, and a plurality of first contacts and second contacts respectively retained in the first wall and second wall and respectively comprising a first contacting portion and a second contacting portion exposed in the central slot; and a memory module, inserted into the central slot at an angle with regard to the printed circuit board, and then rotated toward a horizontal level in a second direction which is substantially opposite to the first direction.

6. The electrical connector assembly as described in claim 5, wherein the first wall extends forward further than the second wall along said front-to-rear direction.

7. The electrical connector assembly as described in claim 5, wherein each first contacting portion of the first contacts is located in front of each second contacting portion of the second contacts in said front-to-rear direction and protruding toward the first face of the printed circuit board.

8. The electrical connector assembly as described in claim 7, wherein the memory module is locked by a pair of locking sections disposed away from the insulating housing when the memory module is completely retained in the central slot.

9. The electrical connector assembly as described in claim 5, wherein the second wall of the insulating housing is closer to the second face of the printed circuit board than the first wall in the first direction.

10. The electrical connector assembly as described in claim 9, wherein the height of each first contact is higher than that of each second contact in said first direction.

11. The electrical connector assembly as described in claim 9, wherein each first contact is inserted into the first wall along the first direction while each second contact is inserted into the second wall along an axis defined by the front-to-rear direction.

12. The electrical connector assembly as described in claim 5, wherein said first face is upward and said second face is downward.

13. An electrical connector assembly comprising:
a printed circuit board, having a predetermined thickness and defining a first face and a second face opposite to the first face;
a low profile electrical connector sitting on the first face of the printed circuit board and comprising an insulating housing defining a longitudinal central slot opened forwardly with first contacts and second contacts respectively retained at opposite sides of the central slot and with an opening forwardly and slantingly communicating with an exterior;
a card, inserted into the central slot at an angle with regard to the printed circuit board, and then rotated from the second face to the first face of the printed circuit board until reaching to a secured position where said card including associated components thereof is at least partially horizontally overlapped with the printed circuit board.

14. The electrical connector assembly as described in claim 13, wherein the printed circuit board defines a notch therein for holding said electrical connector around an inner end thereof.

15. The electrical connector assembly as described in claim 14, wherein the notch defines a closed receiving space in which the card is substantially enclosed by peripheries of the receiving space.

16. The electrical connector assembly as described in claim 14, further comprising a pair of retaining members around an outer end of the notch for securing said card on the printed circuit board in the notch.

17. The electrical connector assembly as described in claim 16, wherein both said housing and said contacts of said connector are configured to define thereof a mounting face confronting said first face of the printed circuit board so as to have said connector mounted to the first face of the printed circuit board in a vertical direction.

18. The electrical connector assembly as described in claim 17, wherein said pair of retaining members are configured to be mounted to the first face of the printed circuit board in said vertical direction under condition that said pair of retaining members are at least partially horizontally overlapped with the printed circuit board.

19. The electrical connector assembly as described in claim 13, wherein said first face is upward and the second face is downward.

20. The electrical connector assembly as described in claim 13, wherein a portion of the insulating housing is located under the second face of the printed circuit board.

\* \* \* \* \*